United States Patent
Lin et al.

(10) Patent No.: US 9,966,339 B2
(45) Date of Patent: May 8, 2018

(54) BARRIER STRUCTURE FOR COPPER INTERCONNECT

(71) Applicant: Taiwan Semiconductor Manufacturing Company, Ltd., Hsin-Chu (TW)

(72) Inventors: Yu-Hung Lin, Taichung (TW); Ching-Fu Yeh, Hsin-Chu (TW); Yu-Min Chang, Hsin-Chu (TW); You-Hua Chou, Hsin-Chu (TW); Chih-Wei Chang, Hsin-Chu (TW); Sheng-Hsuan Lin, Zhubei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days. days.

(21) Appl. No.: 14/290,784

(22) Filed: May 29, 2014

(65) Prior Publication Data
US 2015/0262870 A1   Sep. 17, 2015

Related U.S. Application Data

(63) Continuation-in-part of application No. 14/212,890, filed on Mar. 14, 2014.

(51) Int. Cl.
*H01L 21/4763* (2006.01)
*H01L 23/532* (2006.01)
(Continued)

(52) U.S. Cl.
CPC .. *H01L 23/53233* (2013.01); *H01L 21/28518* (2013.01); *H01L 21/76843* (2013.01);
(Continued)

(58) Field of Classification Search
CPC ......... H01L 2924/0002; H01L 2924/00; H01L 21/76843; H01L 21/76846;
(Continued)

(56) References Cited

U.S. PATENT DOCUMENTS 6,952,052 B1   10/2005   Marathe et al.
8,517,769 B1    8/2013   Lin et al.
(Continued)

FOREIGN PATENT DOCUMENTS

TW        I260740        8/2006

OTHER PUBLICATIONS

He, M., et al., "Mechanism of Co Liner as Enhancement Layer for Cu Interconnect Gap-Fill," Journal of the Electrochemical Society, 160 (12), Jun. 14, 2013, pp. D3040-D3044.
(Continued)

*Primary Examiner* — David Chen
(74) *Attorney, Agent, or Firm* — Slater Matsil, LLP

(57) ABSTRACT

A method for forming an interconnect structure includes forming a dielectric layer overlying a substrate, forming an opening in the dielectric layer, forming a metal-containing layer overlying the opening in the dielectric layer, forming a conformal protective layer overlying the metal-containing layer, filling a conductive layer in the opening, and performing a thermal process to form a metal oxide layer barrier layer underlying the metal-containing layer.

20 Claims, 7 Drawing Sheets

(51) Int. Cl.
  *H01L 23/522* (2006.01)
  *H01L 21/285* (2006.01)
  *H01L 21/768* (2006.01)

(52) U.S. Cl.
  CPC .. *H01L 21/76855* (2013.01); *H01L 21/76873* (2013.01); *H01L 23/5226* (2013.01); *H01L 23/53238* (2013.01); *H01L 23/53295* (2013.01); *H01L 21/2855* (2013.01); *H01L 21/28556* (2013.01); *H01L 2924/0002* (2013.01)

(58) Field of Classification Search
  CPC ......... H01L 23/53238; H01L 21/76873; H01L 21/76855; H01L 21/28518; H01L 21/76867; H01L 21/76831; H01L 21/28556; H01L 21/76864; H01L 21/76877; H01L 23/53295; H01L 21/76883; H01L 21/76834; H01L 21/76856; H01L 2221/1089; H01L 21/28562; H01L 21/76814; H01L 21/76844
  USPC ........ 438/627, 643, 644, 652, 653; 257/751, 257/E21.584, E21.585
  See application file for complete search history.

(56) References Cited

U.S. PATENT DOCUMENTS

| | | | |
|---|---|---|---|
| 8,609,521 B2 | 12/2013 | Zhang | |
| 8,609,531 B1 | 12/2013 | Zhang | |
| 8,722,531 B1 | 5/2014 | Lin et al. | |
| 8,742,581 B2 | 6/2014 | Yang et al. | |
| 2002/0076918 A1* | 6/2002 | Han | H01L 21/76807 438/634 |
| 2003/0129828 A1* | 7/2003 | Cohen | H01L 21/76843 438/629 |
| 2005/0098897 A1 | 5/2005 | Edelstein et al. | |
| 2006/0199386 A1 | 9/2006 | Huang et al. | |
| 2007/0090472 A1* | 4/2007 | Hasunuma | H01L 21/76895 257/412 |
| 2009/0243112 A1 | 10/2009 | Koike et al. | |
| 2009/0280641 A1* | 11/2009 | Kang | H01L 21/28518 438/653 |
| 2010/0140802 A1 | 6/2010 | Matsumoto et al. | |
| 2010/0155951 A1 | 6/2010 | Koike et al. | |
| 2010/0200934 A1* | 8/2010 | Chen | H01L 29/1054 257/402 |
| 2011/0027985 A1 | 2/2011 | Tsumura et al. | |
| 2011/0034026 A1* | 2/2011 | Sunayama | H01L 21/2885 438/653 |
| 2011/0049705 A1 | 3/2011 | Liu et al. | |
| 2011/0101529 A1* | 5/2011 | Kao | H01L 23/53238 257/751 |
| 2011/0147940 A1 | 6/2011 | Akolkar | |
| 2011/0256715 A1 | 10/2011 | Pan et al. | |
| 2012/0070981 A1* | 3/2012 | Clendenning | H01L 21/28562 438/653 |
| 2013/0178058 A1 | 7/2013 | Edelstein et al. | |
| 2013/0244424 A1 | 9/2013 | Edelstein et al. | |
| 2014/0070283 A1* | 3/2014 | Kim | H01L 29/4236 257/288 |
| 2014/0161992 A1 | 6/2014 | Ishizaka et al. | |
| 2014/0252617 A1* | 9/2014 | Ryan | H01L 21/76843 257/751 |

OTHER PUBLICATIONS

Haneda, M., et al., "Growth Behavior of Self-Formed Barrier at Cu—Mn/SiO2 Interface at 250-450 oC," Applied Physics Letters 90, 252107 (2007); 4 pages.

Koike, J., et al., "Self-Forming Diffusion Barrier Layer in Cu—Mn Alloy Metallization," Applied Physics Letters 87, 041911 (2005); 4 pages.

Koike, J., et al., "Cu Alloy Metallization for Self-Forming Barrier Process," 2006 International Interconnect Technology Conference, pp. 161-163.

Nogami, T., et al., "Electromigration Extendibility of Cu(Mn) Alloy-Seed Interconnects, and Understanding the Fundamentals," 2012 IEEE International Electron Devices Meeting (IEDM), pp. 33.7.1-33.7.4.

Nogami, T., et al., "CVD Co and its Application to Cu Damascene Interconnections," 2010 International Interconnect Technology Conference (IITC), pp. 1-3.

* cited by examiner

BARRIER STRUCTURE FOR COPPER INTERCONNECT

PRIORITY CLAIM AND CROSS-REFERENCE

This application is a continuation-in-part of, and claims the benefit of, U.S. patent application Ser. No. 14/212,890, filed on Mar. 14, 2014, titled "Barrier Structure for Copper Interconnect," which is hereby incorporated herein by reference.

BACKGROUND

Semiconductor devices are used in a variety of electronic applications, such as personal computers, cell phones, digital cameras, and other electronic equipment, as examples. As technology has progressed, the demand for smaller semiconductor devices with improved performance has increased. As feature densities increase, the widths of the conductive lines, and the spacing between the conductive lines of back-end of line (BEOL) interconnect structures also need to scale smaller. In addition, other conductive features such as, for example, metal contacts (usually referred as M0) also need to be scaled accordingly.

A move is being made away from the traditional materials used in the past in semiconductor device designs, in order to meet these demands. To reduce the RC time delay, low dielectric constant (low-k) materials are being used as insulating materials, and there is a switch being made to the use of copper for interconnect materials, rather than aluminum. Advantages of using copper for semiconductor device interconnects include abilities to operate faster and manufacture thinner conductive lines because copper has lower resistivity and increased electromigration resistance compared to aluminum. Combining copper interconnects with low-k dielectric materials increases interconnect speed by reducing the RC time delay, for example.

Copper interconnects are often formed using damascene processes rather than by direct etching. Damascene processes are typically either single or dual damascene, which includes forming openings by patterning and etching intermetal dielectric (IMD) layers and filling the openings with copper. Because copper diffuses easily into some dielectric materials, especially some types of low-k dielectric materials, a diffusion barrier layer is usually deposited on the inner walls of the damascene opening before the copper is formed. Refractory metals such as tantalum (Ta) or titanium (Ti), or nitride compounds of these metals are used as materials of the diffusion barrier layer. However, there are some challenges in using refractory metals in the copper damascene structure since these metallic films have high resistance, thereby causing increased resistance in the copper lines and increased RC delay, especially in small, narrow features.

As the shrinkage of copper lines has progressed in recent years, there is a trend towards thinner films being used for the diffusion barrier layer. Physical vapor deposition (PVD) process used for depositing a thinner TaN/Ta barrier layer encounters difficulties in advanced scale of interconnection. Atomic layer deposition (ALD) process is the candidate to deposit a very thin diffusion barrier layer with uniform coverage, but the ALD method is disadvantageous in extremely low deposition rate and poor throughput. In addition, in manufacturing the TaN/Ta film, a problem occurs in which favorable adhesion between diffusion barrier layer and the IMD layer cannot be achieved. For example, copper lines peel off at the interface, worsening the yield of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
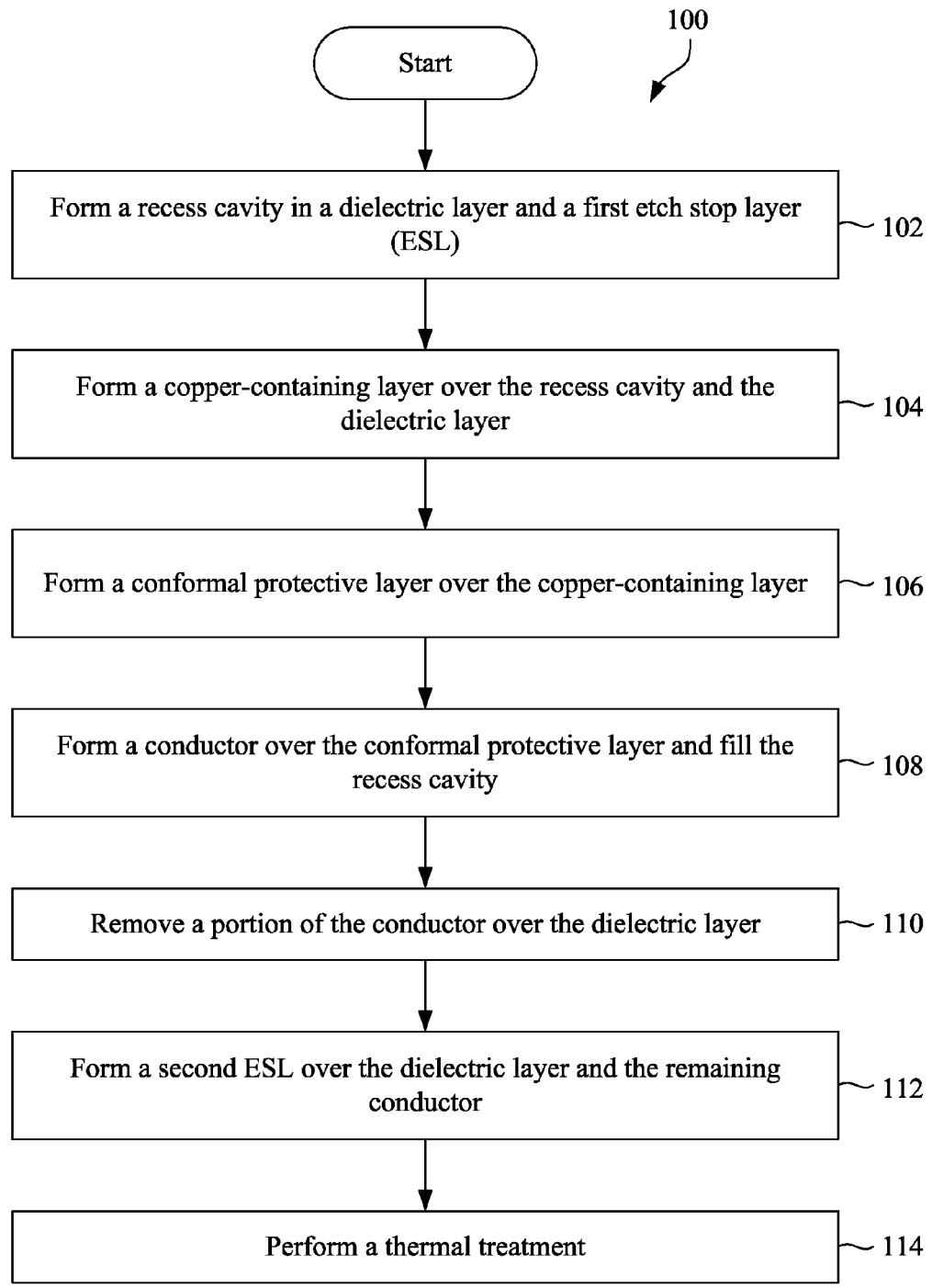
FIG. 1 is a flowchart illustrating a method for fabricating a semiconductor device comprising an interconnect according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart illustrating a method 100 for fabricating a semiconductor device 200 according to various aspects of the present disclosure. FIGS. 2-6 show schematic cross-sectional views of a semiconductor device 200 at various stages of fabrication according to an embodiment of the method 100 of FIG. 1. The semiconductor device 200 may be included in a microprocessor, a memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 1 through 6 are simplified for a better understanding of the present disclosure. For example, although the figures illustrate the semiconductor device 200, it is understood the IC may comprise a number of other devices comprising transistors, resistors, capacitors, inductors, fuses, etc.

Figure 2:
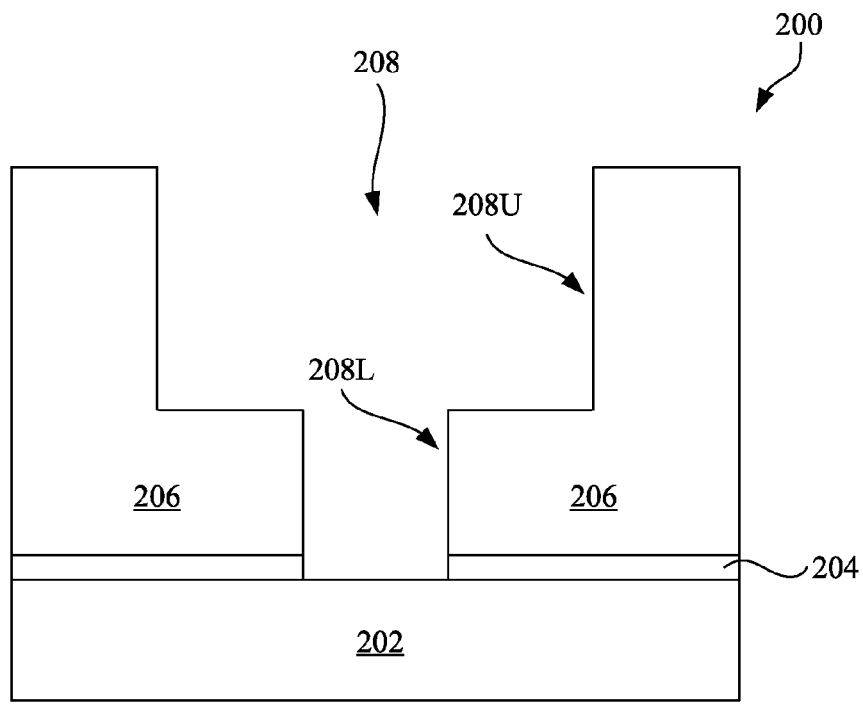
FIGS. 2-6 show schematic cross-sectional views of an interconnect structure of a semiconductor device at various stages of fabrication according to various aspects of the present disclosure.

Referring to FIGS. 1 and 2, the method 100 begins at step 102 wherein a recess cavity 208 is formed in a dielectric layer 206. In some embodiments, the dielectric layer 206 is referred to as an inter-metal dielectric (IMD) layer. In some embodiments, a first etch stop layer 204 is formed over a semiconductor substrate 202 and under the dielectric layer 206. In some embodiments, the recess cavity 208 is formed in the dielectric layer 206 and the first etch stop layer 204. The semiconductor substrate 202 is a substrate as employed in a semiconductor integrated circuit fabrication, and integrated circuits may be formed therein and/or thereupon. The term "semiconductor substrate" is defined to mean any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices. A conductive region formed in and/or on the semiconductor substrate 202 is a portion of conductive routes and has exposed surfaces that may be treated by a planarization process, such as chemical mechanical polishing. Suitable materials for the conductive regions may include, but not limited to, for example copper, aluminum, copper alloy, or other mobile conductive materials. Copper interconnect level may be the first or any subsequent metal interconnect level of the semiconductor device.

In some embodiments, the first etch stop layer 204 functions for controlling the end point during subsequent etching processes. In some embodiments, the first etch stop layer 204 is formed of silicon oxide, silicon nitride, silicon carbide, silicon oxynitride or combinations thereof. In some embodiments, the first etch stop layer 204 has a thickness of about 10 Angstroms to about 1000 Angstroms. The first etch stop layer 204 is formed through any of a variety of deposition techniques, including LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures.

The dielectric layer 206 may be a single layer or a multi-layered structure. In some embodiments, the dielectric layer 206 has a thickness that varies with the applied technology, for example a thickness of about 1000 Angstroms to about 30000 Angstroms. In some embodiments, the dielectric layer 206 is silicon oxide, carbon-doped silicon oxide, a comparatively low dielectric constant (k value) dielectric material with a k value less than about 4.0, or combinations thereof. In some embodiments, the dielectric layer 206 is formed of a material, including low-k dielectric material, extreme low-k dielectric material, porous low-k dielectric material, and combinations thereof. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed in accordance with embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. In some embodiments, the dielectric layer 206 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the substrate.

In embodiments, the dielectric layer 206 is a nitrogen-containing layer, a carbon-containing layer, or a carbon-containing and nitrogen-containing layer for increasing corrosion resistance during a subsequent chemical mechanical polishing (CMP) process and/or increasing electromigration resistance. In one embodiment, the dielectric layer 206 is a silicon-containing and nitrogen-containing dielectric layer. In another embodiment, the dielectric layer 206 is a silicon-containing and carbon-containing dielectric layer. In another embodiment, the dielectric layer 206 is a silicon-containing, nitrogen-containing, and carbon-containing dielectric layer. In one embodiment, the dielectric layer 206 has a ratio by weight of carbon to silicon about equal or greater than 0.5. In another embodiment, the dielectric layer 206 has a ratio by weight of nitrogen to silicon about equal or greater than 0.3. In another embodiment, the dielectric layer 206 has a ratio by weight of carbon to silicon about equal or greater than 0.5 and a ratio by weight of nitrogen to silicon about equal or greater than 0.3.

The recess cavity 208 is an exemplary dual damascene opening including an upper trench section 208U and a lower via-hole section 208L patterned in the dielectric layer 206 and the first etch stop layer 204 to define a contact region on the semiconductor substrate 202. Although the embodiments illustrate dual damascene openings in the IMD layer, the use of single damascene openings in the IMD layer also provide values. In dual damascene techniques including a "via-first" patterning method or a "trench-first" patterning method, the upper trench section 208U and the lower via-hole section 208L may be formed using a typical lithographic with masking technologies and anisotropic etch operation (e.g., plasma etching or reactive ion etching). In alternative embodiments, a bottom etch stop layer (not shown), a middle etch stop layer (not shown), a polish stop layer (not shown), or an anti-reflective coating (ARC) layer (not shown) is deposited on or intermediately in the dielectric layer 206, providing a clear indicator of when to end a particular etching process.

Figure 3:
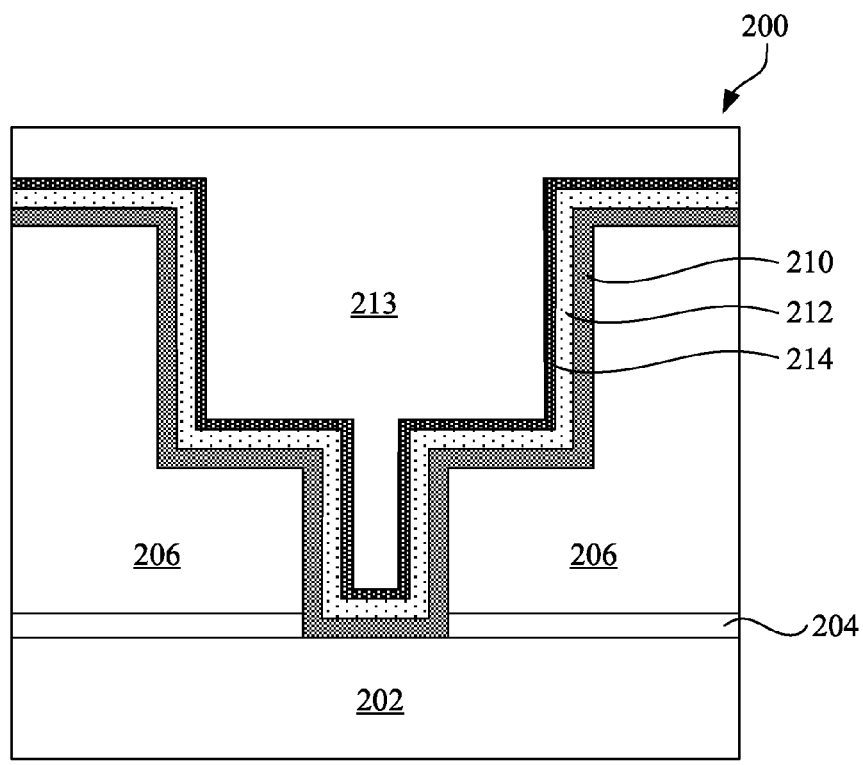

Referring to FIGS. 1 and 3, the method 100 proceeds to step 104 wherein a copper-containing layer 210 is formed on the above-described structure to line the sidewalls and bottoms of the recess cavity 208 and over the dielectric layer 206. In one embodiment, the copper-containing layer 210 is a metal alloy layer containing at least a main metal element, copper (Cu), and an additive metal element. In some embodiments, the additive metal element includes manganese (Mn), aluminum (Al), titanium (Ti), niobium (Nb), chromium (Cr), vanadium (V), yttrium (Y), technetium (Tc), rhenium (Re), or combinations thereof.

In some embodiments, the copper-containing layer 210 is copper-manganese (CuMn) layer with a crystal structure of face center cubic (FCC). In some embodiments, a ratio of manganese to copper contained in the CuMn layer ranges from about 0.02% to about 5.00%. In some embodiments, the copper-containing layer 210 has a thickness of about 20 Angstroms to about 200 Angstroms. In some embodiments, the copper-containing layer 210 is deposited by using physical vapor deposition (PVD), chemical vapor deposition (CVD), plasma-enhanced CVD (PECVD), low pressure CVD (LPCVD), or other well-known deposition techniques.

Still referring to FIGS. 1 and 3, the method 100 proceeds to step 106 wherein a protective layer 212 is conformally deposited over the copper-containing layer 210. The conformal protective layer 212 may function as a barrier to prevent a subsequently formed conductor from diffusing into the underlying dielectric layer 206. In some embodiments, the conformal protective layer 212 includes cobalt (Co), ruthenium (Ru) or combinations thereof and Co has a resistivity of about 62.4 nΩ-m at 20 degrees Celsius, which is lower than the resistivity of typical diffusion barrier layers including Ta, Ti, W, or TaN barrier layers. Therefore, a low resistance of the conformal protective layer 212 can be achieved to decrease a RC delay issue.

In some embodiments, the protective layer 212 is deposited conformally above the copper-containing layer 210 by using chemical vapor deposition (CVD), atomic layer deposition (ALD) or other well-known conformal deposition techniques. The protective layer 212 is conformally deposited to avoid a gap filling issue during the subsequent opening filling process. In some embodiments, the conformal protective layer 212 has a thickness of about 10 Angstroms to about 50 Angstroms. In some embodiments, a combined thickness of the copper-containing layer 210 and the conformal protective layer 212 is less than about 120 Angstroms to prevent a gap filling issue during the subsequent opening filling process.

The method 100 of FIG. 1 proceeds to step 108 wherein a conductor 213 is formed over the conformal protective layer 212 to fill the recess cavity 208. In some embodiments, the conductor 213 is formed as an interconnect structure in the dielectric layer 206. In some embodiments, the conductor 213 is deposited by an electro-chemical plating (ECP) process. In some embodiments, the conductor 213 at least contains the main metal element, e.g., copper (Cu). In some embodiments, the conductor 213 further contains an additive metal element. In some embodiments, the conductor 213 contains an additive metal element different from the additive metal element in the copper-containing layer 210. In some embodiments, the additive metal element in the conductor 213 is tantalum, indium, tin, zinc, manganese, chromium, titanium, germanium, strontium, platinum, magnesium, aluminum or zirconium.

In some embodiments, a conductive seed layer 214 is formed before forming the conductor 213. In some embodiments, the conductive seed layer 214 contains a pure metal, such as copper. In some embodiments, the conductive seed layer 214 at least contains the main metal element, e.g., copper (Cu), as contained in the conductor 213. In some embodiments, the conductive seed layer 214 is a copper-containing layer, such as CuAl, CuMn, or the like. In some embodiments, the conductive seed layer 214 is formed by using physical vapor deposition (PVD) or other well-known deposition techniques. In some embodiments, the conductive seed layer 214 has a thickness of about 100 Angstroms to about 450 Angstroms.

Figure 4:
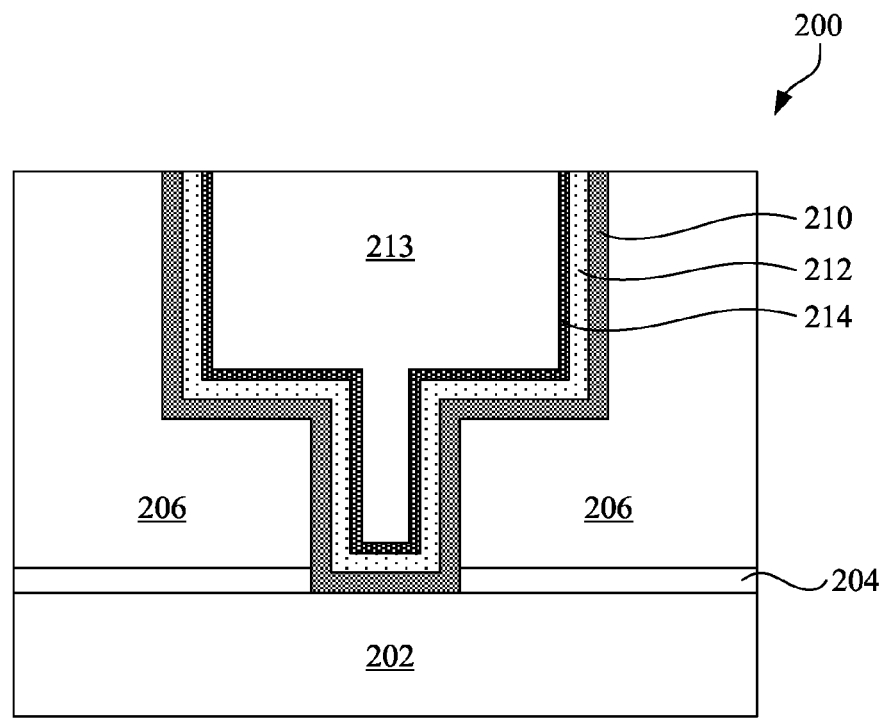

Referring to FIGS. 1 and 4, the method 100 proceeds to step 110 wherein the portion of conductor 213 over the dielectric layer 206 is removed. In some embodiments, the removing process is chemical mechanical polishing (CMP) process performed to remove the excess portions of the conductor 213, the conductive seed layer 214, the protective layer 212, and the copper-containing layer 210 outside the recess cavity 208, thus exposing the top surface of the dielectric layer 206 and achieving a planarized surface.

Figure 5:
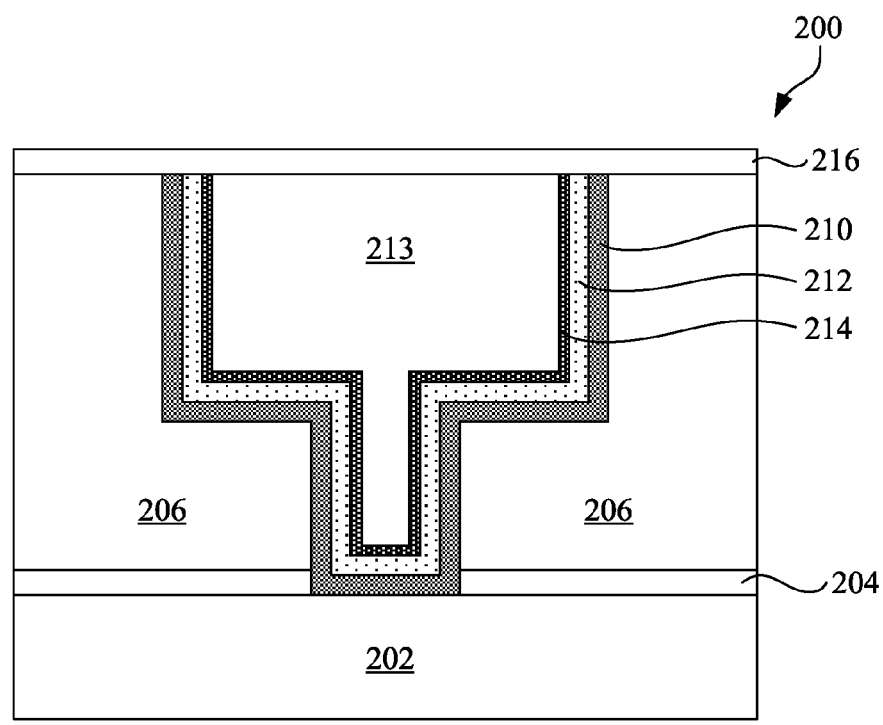

Referring to FIGS. 1 and 5, the method 100 proceeds to step 112 wherein a second etch stop layer 216 is formed on the above-described planarized surface. The second etch stop layer 216 may control the end point during subsequent etching processes. In some embodiments, the second etch stop layer 216 is formed of silicon oxide, silicon nitride, silicon carbide, silicon oxynitride or combinations thereof. In some embodiments, the second etch stop layer 216 has a thickness of about 10 Angstroms to about 1000 Angstroms. In some embodiments, the second etch stop layer 216 is formed through any of a variety of deposition techniques, including LPCVD, APCVD, PECVD, PVD, and sputtering.

Figure 6:
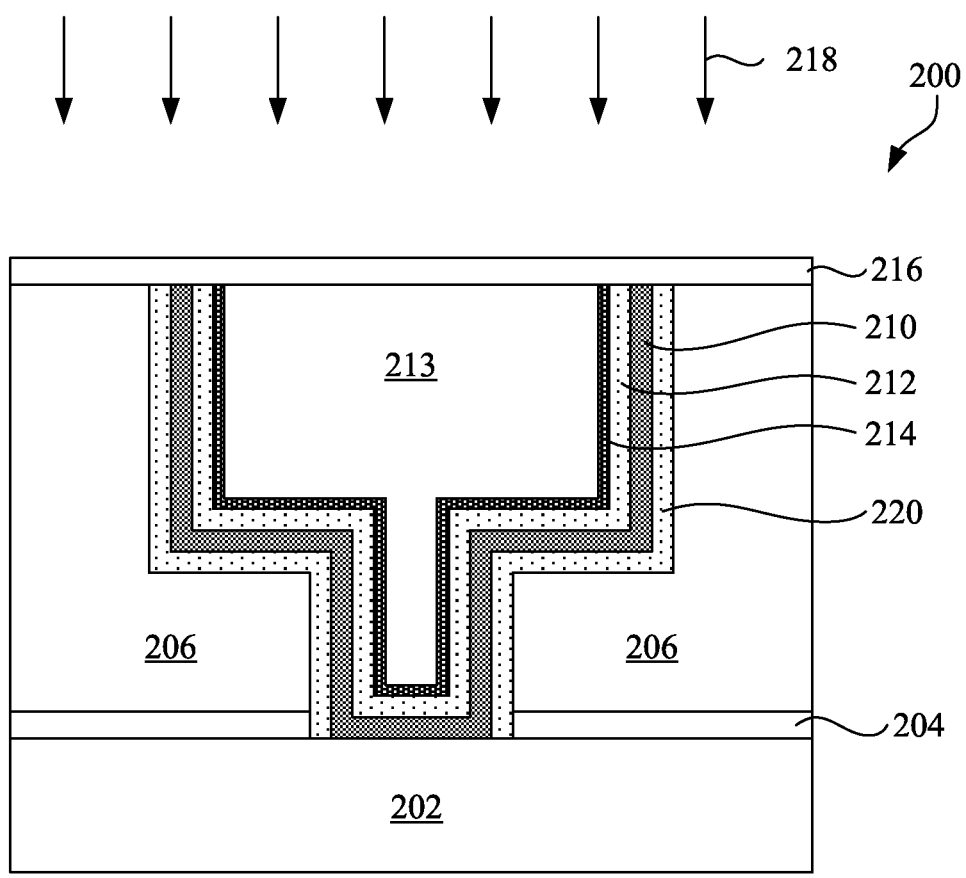

Referring to FIGS. 1 and 6, the method 100 proceeds to step 114 wherein a thermal treatment 218 is performed on the semiconductor substrate 202. In some embodiments, the thermal treatment 218 includes an annealing process. In one embodiment, the thermal treatment 218 is performed at a temperature ranged from about 137 degrees Celsius to about 600 degrees Celsius. In another embodiment, the thermal treatment 218 is performed at a temperature ranged from about 280 degrees Celsius to about 400 degrees Celsius. In one embodiment, the thermal treatment 218 is performed at a duration ranged from about 10 minutes to about 600 minutes. In some embodiments, the thermal treatment 218 is performed using a chemical vapor deposition (CVD) process, furnace, rapid thermal processing (RTP), hot plate equipment, or any of a variety of heat treatment techniques.

During and/or after the thermal process, in some embodiments, the additive metal element in the copper-containing layer 210 partially or completely diffuses to the surface of the dielectric layer 206. In some embodiments, the diffused additive metal element reacts with the dielectric layer 206 to form a diffusion barrier layer 220. The diffusion barrier layer 220 is formed in a self-aligned manner at the boundary between the dielectric layer 206 and the copper-containing layer 210. In one embodiment, the diffusion barrier layer 220 has a thickness ranging from about 1 angstrom to about 30 Angstroms. In another embodiment, the diffusion barrier layer 220 has a thickness ranging from about 1 angstrom to about 15 Angstroms. In some embodiments, the formation of the diffusion barrier layer 220 consumes some of the dielectric layer 206 and the copper-containing layer 210. In one embodiment, the diffusion barrier layer 220 is a metal oxide layer because the oxygen existed in the dielectric layer 206 reacts with the additive metal element in the copper-containing layer 210 during the heating treatment process. In some embodiments, the metal oxide layer is $MnO_x$ and/or $MnSi_yO_z$. In alternative embodiments, the metal oxide layer is $TiO_x$, $AlO_x$, $CoO_x$, $VO_x$, $YO_x$, $TcO_x$, $ReO_x$, or combinations thereof. In some embodiments, the diffusion barrier layer 220 has a weight ratio of manganese to oxygen from about 0.1 to about 10. The diffusion barrier layer 220 may function as a protector to prevent the conductor 213 and/or the conductive seed layer 214 from diffusing into the dielectric layer 206.

The step of thermal treatment can be provided by any thermal processing after forming the copper-containing layer 210. In alternative embodiments, the step of thermal treatment is provided at the time immediately after the formation of the copper-containing layer 210, immediately after the step of CMP of removing the excess portions of the conductor 213 outside the recess cavity 208, immediately after the step of forming the second etch stop layer 216, or after the step of forming a passivation layer on a top metal layer.

Figure 7:
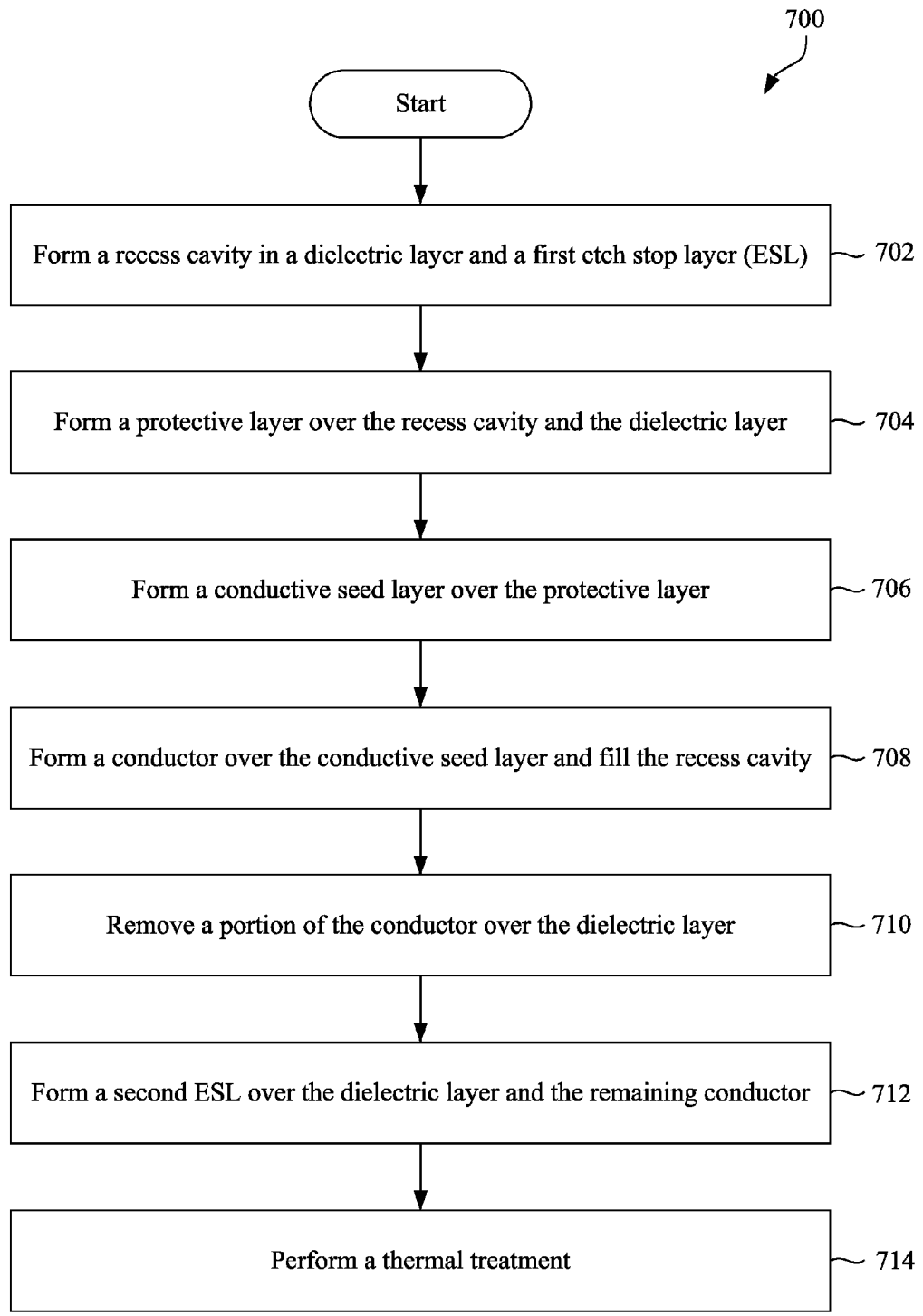
FIG. 7 is a flowchart illustrating a method for fabricating a semiconductor device comprising an interconnect according to various aspects of the present disclosure.

FIG. 7 is a flowchart illustrating a second method 700 for fabricating a semiconductor device 800 in accordance with some embodiments. FIGS. 8-11 illustrate schematic cross-sectional views of the semiconductor device 800 at various stages of fabrication starting from a structure illustrated in FIG. 2 according to an embodiment of the second method 700 of FIG. 7. As described below in greater detail, the semiconductor device 800 may have a barrier structure lining the conductor 213 different from that of the semiconductor device 200 (see FIGS. 6 and 11). For example, in some embodiments, the semiconductor device 800 may have fewer barrier layers than the semiconductor device 200 (see FIGS. 6 and 11) without compromising performance of the semiconductor device 800. In other embodiments, the semiconductor device 800 may have a different arrangement of barrier layers compared to the semiconductor device 200.

The semiconductor device 800 may be included in a microprocessor, a memory cell, and/or other integrated circuit (IC). It is noted that the second method of FIG. 7 does not produce a completed semiconductor device 800. The completed semiconductor device 800 may be fabricated, for example, using complementary metal-oxide-semiconductor (CMOS) technology processing. Accordingly, it is understood that additional processes may be provided before, during, and/or after the second method 700 of FIG. 7, and that some other processes may only be briefly described herein. Also, FIGS. 8 through 11 are simplified for a better understanding of the present disclosure. For example, although the figures illustrate the semiconductor device 800, it is understood the IC may comprise a number of other devices comprising transistors, resistors, capacitors, inductors, fuses, etc.

Referring to FIG. 7, the second method 700 begins at step 702, which is similar to step 102 of the method 100 described above with reference to FIGS. 1 and 2, and the description will not be repeated here.

Figure 8:
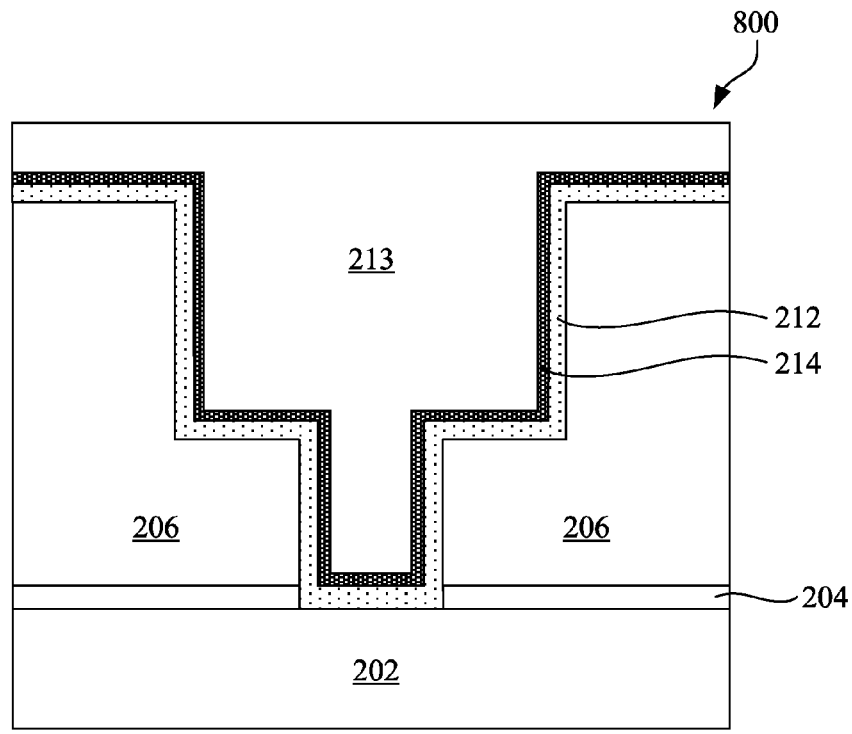
FIGS. 8-11 show schematic cross-sectional views of an interconnect structure of a semiconductor device at various stages of fabrication according to various aspects of the present disclosure.

Referring to FIGS. 7 and 8, the second method 700 proceeds to step 704 wherein a protective layer 212 is formed on the structure of FIG. 2 to line the sidewalls and bottoms of the recess cavity 208 and over the dielectric layer 206. The protective layer 212 may function as a barrier to prevent a subsequently formed conductive material from diffusing into the underlying dielectric layer 206. In the illustrated embodiment, the protective layer 212 comprises cobalt (Co).

In some embodiments, the protective layer 212 of cobalt (Co) is formed using two deposition processes. For example, a first sublayer (not shown) of the protective layer 212 is deposited using physical vapor deposition (PVD), radio frequency PVD (RFPVD), or the like. In some embodiments, the first sublayer of protective layer 212 has a thickness of about 3 Angstroms to about 50 Angstroms along the sidewalls of the recess cavity 208, and a thickness of about 30 Angstroms to about 300 Angstroms along the bottom of the recess cavity 208. Subsequently, a second sublayer (not shown) of the protective layer 212 is deposited using chemical vapor deposition (CVD), atomic layer deposition (ALD) or other well-known conformal deposition techniques. For example, the second sublayer of the protective layer 212 of cobalt (Co) may be formed using cobalt containing precursors, such as $C_{12}H_{10}O_6(Co)_2$ at a temperature of about 90° C. to about 350° C., biscyclopentadienyl cobalt $(CoCp_2)$ at a temperature of about 100° C. to about 500° C., cyclopentadienyl dicarbonyl cobalt $(CoCp_2(CO)_2)$ at a temperature of about 100° C. to about 500° C., or the like. The second sublayer of the protective layer 212 is conformally deposited to avoid a gap filling issue during the subsequent opening filling process. In some embodiments, the second sublayer of the protective layer 212 has a thickness of about 10 Angstroms to about 80 Angstroms along the sidewalls of the recess cavity 208, and a thickness of about 10 Angstroms to about 200 Angstroms along the bottom of the recess cavity 208. Accordingly, the protective layer 212 has a thickness of about 13 Angstroms to about 130 Angstroms along the sidewalls of the recess cavity 208, and a thickness of about 40 Angstroms to about 500 Angstroms along the bottom of the recess cavity 208.

In other embodiments, the protective layer 212 of cobalt (Co) is formed using a single deposition process such as chemical vapor deposition (CVD), atomic layer deposition (ALD) or the like. For example, the protective layer 212 of cobalt (Co) may be formed using cobalt containing precursors, such as $C_{12}H_{10}O_6(Co)_2$ at a temperature of about 90° C. to about 350° C., biscyclopentadienyl cobalt $(CoCp_2)$ at a temperature of about 100° C. to about 500° C., cyclopentadienyl dicarbonyl cobalt $(CoCp_2(CO)_2)$ at a temperature of about 100° C. to about 500° C., or the like. The protective layer 212 may have a thickness of about 10 Angstroms to about 80 Angstroms along the sidewalls of the recess cavity 208, and a thickness of about 40 Angstroms to about 500 Angstroms along the bottom of the recess cavity 208.

Referring to FIGS. 7 and 8, the second method 700 proceeds to step 706 wherein a conductive seed layer 214 is formed over the protective layer 212. In the illustrated embodiment, the conductive seed layer 214 is copper-manganese (CuMn) layer with a crystal structure of face center cubic (FCC). In some embodiments, a ratio of manganese to copper contained in the CuMn layer ranges from about 0.02% to about 5.00%. In some embodiments, the conductive seed layer 214 has a thickness of about 100 Angstroms to about 550 Angstroms. In some embodiments, the conductive seed layer 214 is deposited by using physical vapor deposition (PVD), chemical vapor deposition (CVD), plasma-enhanced CVD (PECVD), low pressure CVD (LP-CVD), or other well-known deposition techniques.

The second method 700 of FIG. 7 proceeds to step 708 wherein a conductor 213 is formed over the conductive seed layer 214 to fill the recess cavity 208. Step 708 of the second method 700 is similar to step 108 of the method 100 of FIG. 1 and the description will not be repeated here.

Figure 9:
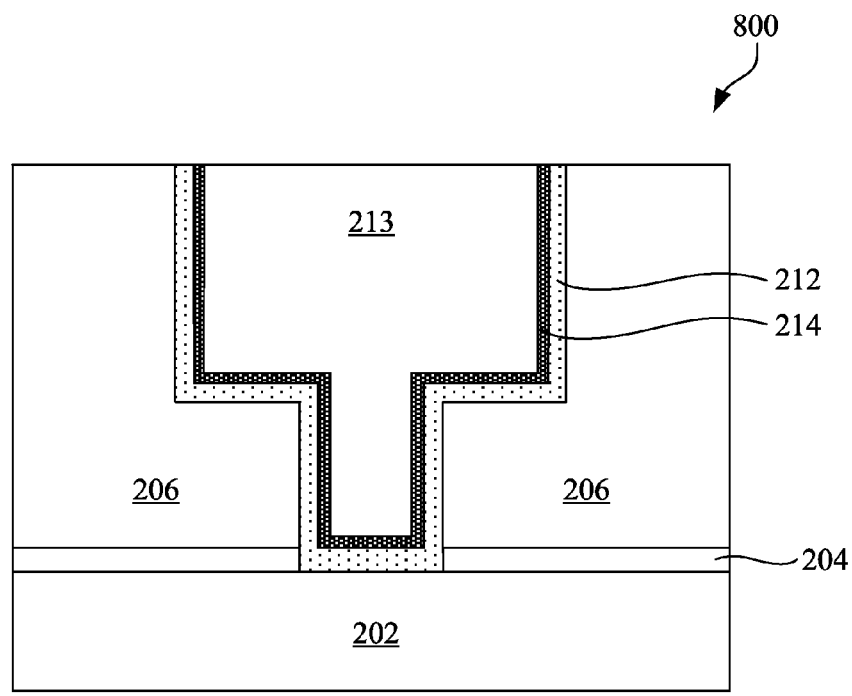

Referring to FIGS. 7 and 9, the second method 700 proceeds to step 710 wherein the portion of conductor 213 over the dielectric layer 206 is removed. Step 710 of the second method 700 is similar to step 110 of the method 100 of FIG. 1 and the description will not be repeated here.

Figure 10:
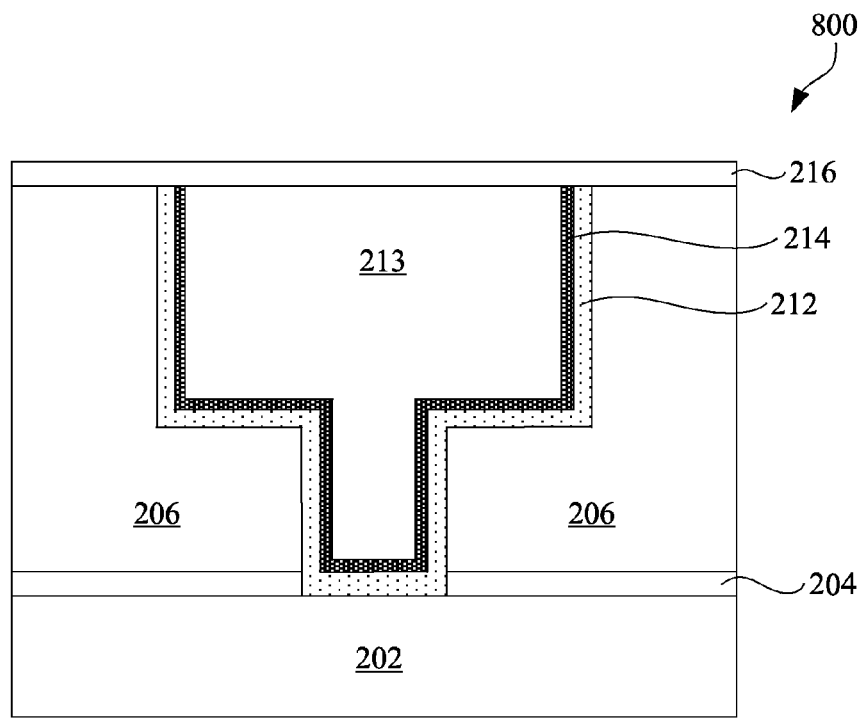

Referring to FIGS. 7 and 10, the second method 700 proceeds to step 712 wherein a second etch stop layer 216 is formed on the above-described planarized surface. Step 712 of the second method 700 is similar to step 112 of the method 100 of FIG. 1 and the description will not be repeated here.

Figure 11:
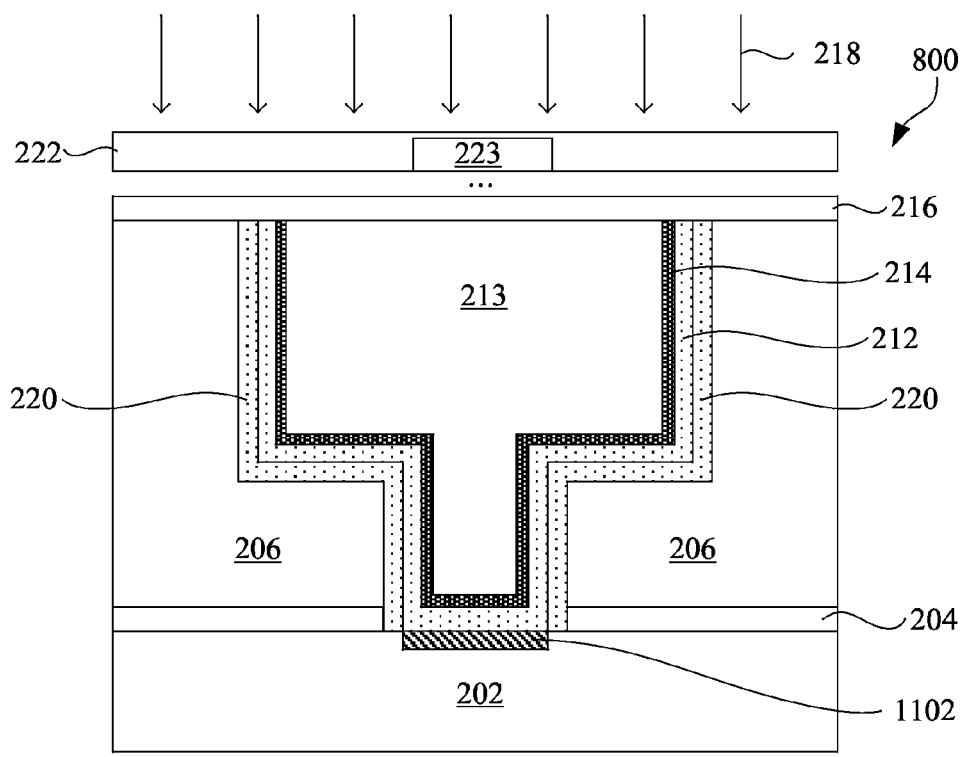

Referring to FIGS. 7 and 11, the second method 700 proceeds to step 714 wherein a thermal treatment 218 is performed on the semiconductor substrate 202. In some embodiments, the thermal treatment 218 includes an annealing process. In one embodiment, the thermal treatment 218 is performed at a temperature from about 200 degrees Celsius to about 800 degrees Celsius, and under argon (Ar) atmosphere at a pressure from about 770 Torr to about 850 Torr. In some embodiments, the thermal treatment 218 may be performed at a duration from about 10 minutes to about 600 minutes. In some embodiments, the thermal treatment 218 is performed using a chemical vapor deposition (CVD) process, furnace, rapid thermal processing (RTP), hot plate equipment, or any of a variety of heat treatment techniques.

During and/or after the thermal process, in some embodiments, the additive metal element in the conductive seed layer 214 partially or completely diffuses through the protective layer 212 to the surface of the dielectric layer 206. In some embodiments, the diffused additive metal element reacts with the dielectric layer 206 to form a diffusion barrier layer 220. The diffusion barrier layer 220 is formed in a self-aligned manner at the boundary between the dielectric layer 206 and the protective layer 212. In the illustrated embodiment, the diffusion barrier layer 220 has a thickness ranging from about 3 Angstroms to about 150 Angstroms. In some embodiments, the formation of the diffusion barrier layer 220 consumes some of the dielectric layer 206 and the conductive seed layer 214. In the illustrated embodiment, the diffusion barrier layer 220 is a metal oxide layer because the oxygen in the dielectric layer 206 reacts with the additive metal element in the conductive seed layer 214 during the heating treatment process. In the illustrated embodiment, the conductive seed layer 214 is formed of copper-manganese (CuMn) and the metal oxide layer is $MnO_x$ and/or $MnSi_yO_z$, while cobalt (Co) in the protective layer 212 acts a catalyst for the oxidation reaction. The diffusion barrier layer 220 may function as a protector to prevent the conductor 213 and/or the conductive seed layer 214 from diffusing into the dielectric layer 206.

Referring further to FIG. 11, a salicide contact 1102 is formed in the semiconductor substrate 202 below the bottom of the recess cavity 208. In some embodiments, a metal of the protective layer 212 reacts to the silicon of the substrate to form a self-aligned silicide (salicide) layer. In the illustrated embodiment with the protective layer 212 formed of cobalt (Co), the salicide contact 1102 is formed of cobalt silicide (CoSi). In some embodiments, the salicide contact 1102 may have a thickness between about 20 Angstroms to about 200 Angstroms.

The step of thermal treatment can be provided by any thermal processing after forming the conductive seed layer 214. In alternative embodiments, the step of thermal treatment is provided at the time immediately after the formation of the conductive seed layer 214, immediately after the step of CMP of removing the excess portions of the conductor 213 outside the recess cavity 208, immediately after the step of forming the second etch stop layer 216, or after the step of forming a passivation layer 222 on a top metal layer 223.

Advantages of one or more embodiments of the present disclosure may include one or more of the following.

In one or more embodiments, the conformal protective layer includes Co or Ru having a low resistivity to decrease contact resistance and RC delay issues thereby improving device performance.

In one or more embodiments, as the protective layer is conformally deposited in a damascene opening, gap filling issues are avoided during the subsequent opening filling process.

In one or more embodiments, the diffusion barrier layer formed in a self-aligned manner can solve the contact issue to improve package capabilities.

In one or more embodiments, the conformal protective layer over the diffusion barrier layer may improve the interconnect conductor from diffusing into an IMD layer to ensure package capabilities.

Various aspects of the present disclosure have been described. According to one aspect of this description, a method of manufacturing a semiconductor device, includes forming a dielectric layer overlying a substrate, forming an opening in the dielectric layer, forming a metal-containing layer overlying the opening in the dielectric layer, forming a conformal protective layer overlying the metal-containing layer, filling a conductive layer in the opening, and performing a thermal process to form a metal oxide barrier layer underlying the metal-containing layer.

According to another aspect of this description, a method of manufacturing a semiconductor device, includes forming a dielectric layer overlying a substrate, forming an opening in the dielectric layer, forming a copper manganese (CuMn) layer overlying the opening in the dielectric layer, forming a conformal cobalt (Co) or ruthenium (Ru) layer overlying the CuMn layer, filling a conductive layer in the opening, performing a chemical mechanical polishing (CMP) process to remove the portions of conductive layer outside the opening, and performing a thermal process to form a MnOx barrier layer underlying the CuMn layer.

According to yet another aspect of this description, a semiconductor device includes a dielectric layer overlying a substrate, a conductive line with a sidewall in the dielectric layer, a conformal cobalt (Co) or ruthenium (Ru) layer adjoining the sidewall of the conductive line, and a metal oxide barrier layer formed between the conductive line and the dielectric layer.

In an embodiment, a semiconductor device comprises a dielectric layer overlying a substrate, the dielectric layer having a recess, and a first barrier layer along a sidewall of the recess. The semiconductor device further comprises a second barrier layer over the first barrier layer, and a conductive material over the second barrier layer, wherein the conductive material and the first barrier layer have a same chemical element.

In another embodiment, a semiconductor device comprises a dielectric layer overlying a substrate, an interconnect in the dielectric layer, and a cobalt (Co) layer interposed between the interconnect and the dielectric layer. The semiconductor device further comprises a manganese oxide layer interposed between the Co layer and the dielectric layer, and a copper manganese layer interposed between a sidewall of the interconnect and the Co layer.

In yet another embodiment, a method of forming a semiconductor device, the method comprises forming a dielectric layer over a substrate, forming an opening in the dielectric layer, and forming a first barrier layer overlying the opening in the dielectric layer. The method further comprises forming a seed layer overlying the first barrier layer, the seed layer comprising a first conductive material, filling the opening with a second conductive material, and performing a thermal process to form a second barrier layer, the second barrier layer being interposed between the first barrier layer and the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a dielectric layer over a substrate, the dielectric layer comprising oxygen;
   forming an opening in the dielectric layer;
   forming a first barrier layer overlying the opening in the dielectric layer, the first barrier layer comprising a first conductive material, wherein the forming the first barrier layer comprises:
      depositing a first cobalt (Co) layer using a radio frequency physical vapor deposition (RFPVD) method, wherein a thickness of the first Co layer along a bottom of the opening is between about 30 Angstroms to about 300 Angstroms, and wherein a thickness of the first Co layer along a sidewall of the opening is between about 3 Angstroms to about 50 Angstroms; and
      depositing a second Co layer on the first Co layer using a chemical vapor deposition (CVD) method or an atomic layer deposition (ALD) method, wherein a thickness of the second Co layer along the bottom of the opening is between about 10 Angstroms to about 200 Angstroms, and wherein a thickness of the second Co layer along the sidewall of the opening is between about 10 Angstroms to about 80 Angstroms;
   forming a seed layer overlying the first barrier layer, the seed layer comprising a second conductive material, the second conductive material being different from the first conductive material;
   filling the opening with a third conductive material;
   depositing an etch stop layer on the third conductive material, the etch stop layer having a thickness from about 10 Angstroms to about 1000 Angstroms; and
   performing a thermal process to form a second barrier layer and a silicide layer, the second barrier layer comprising an oxide of the second conductive material, the second barrier layer physically contacting the dielectric layer, the second barrier layer being interposed between the first barrier layer and the dielectric layer, the silicide layer comprising a silicide of the first conductive material, the silicide layer physically contacting the substrate, the silicide layer being interposed between the first barrier layer and the substrate.

2. The method of claim 1, wherein the silicide layer comprises cobalt silicide.

3. The method of claim 1, wherein the second barrier layer comprises manganese oxide ($MnO_x$).

4. The method of claim 1, wherein the third conductive material is different from the first conductive material and the second conductive material.

5. The method of claim 1, wherein the seed layer comprises copper-manganese (CuMn).

6. A method comprising:
   forming a first dielectric layer over a substrate;
   forming a second dielectric layer over the first dielectric layer, the second dielectric layer comprising oxygen;
   forming an opening in the first dielectric layer and the second dielectric layer;
   forming a first barrier layer on a sidewall and a bottom of the opening, wherein the forming the first barrier layer comprises:
      depositing a first cobalt (Co) layer using a radio frequency physical vapor deposition (RFPVD) method; and
      depositing a second Co layer on the first Co layer using a chemical vapor deposition (CVD) method or an atomic layer deposition (ALD) method;
   forming a seed layer over the first barrier layer, wherein the seed layer comprises copper and manganese;
   forming a conductive feature in the opening;
   depositing an etch stop layer on the conductive feature; and
   performing a thermal process to form a second barrier layer and a silicide layer, the second barrier layer being an oxide layer, the second barrier layer extending along the sidewall of the opening, the silicide layer extending along the bottom of the opening, no portion of the silicide layer being interposed between the sidewall of the opening and the first barrier layer.

7. The method of claim 6, further comprising:
   planarizing the conductive feature and the second dielectric layer, wherein the etch stop layer is formed on the conductive feature and the second dielectric layer.

8. The method of claim 6, wherein the first barrier layer acts a catalyst for an oxidation reaction forming the second barrier layer.

9. The method of claim 6, wherein the second barrier layer comprises an oxide of manganese.

10. The method of claim 6, wherein the silicide layer comprises cobalt silicide (CoSi).

11. The method of claim 6, wherein a thickness of the first barrier layer along the bottom of the opening is greater than a thickness of the first barrier layer along the sidewall of the opening.

12. The method of claim 6, wherein a thickness of the first Co layer along the bottom of the opening is between about 30 Angstroms to about 300 Angstroms, and wherein a thickness of the first Co layer along the sidewall of the opening is between about 3 Angstroms to about 50 Angstroms.

13. The method of claim 12, wherein a thickness of the second Co layer along the bottom of the opening is between about 10 Angstroms to about 200 Angstroms, and wherein a thickness of the second Co layer along the sidewall of the opening is between about 10 Angstroms to about 80 Angstroms.

14. A method comprising:
   forming a dielectric layer over a substrate, the dielectric layer comprising oxygen;
   patterning the dielectric layer to form an opening in the dielectric layer;
   depositing a cobalt (Co) barrier layer on a sidewall and a bottom of the opening, wherein depositing the Co barrier layer comprises:
      depositing a first Co layer using a first method, wherein a thickness of the first Co layer along the bottom of the opening is between about 30 Angstroms to about 300 Angstroms, and wherein a thickness of the first Co layer along the sidewall of the opening is between about 3 Angstroms to about 50 Angstroms; and
      depositing a second Co layer on the first Co layer using a second method, the second method being different from the first method, wherein a thickness of the second Co layer along the bottom of the opening is between about 10 Angstroms to about 200 Angstroms, and wherein a thickness of the second Co layer along the sidewall of the opening is between about 10 Angstroms to about 80 Angstroms;

depositing a copper-manganese (CuMn) layer over the Co barrier layer;

filling the opening with a conductive material;

depositing an etch stop layer on the conductive material, the etch stop layer having a thickness from about 10 Angstroms to about 1000 Angstroms; and annealing the substrate to form a manganese oxide ($MnO_x$) layer and a cobalt silicide (CoSi) layer, the $MnO_x$ layer extending along the sidewall of the opening, the CoSi layer extending along the bottom of the opening, no portion of the CoSi layer being interposed between the sidewall of the opening and the Co barrier layer.

15. The method of claim 14, wherein the conductive material comprises copper (Cu).

16. The method of claim 14, wherein a ratio of manganese (Mn) to copper (Cu) in the CuMn layer is from about 0.02% to about 5%.

17. The method of claim 16, wherein the $MnO_x$ layer has a thickness ranging from about 3 Angstroms to about 150 Angstroms.

18. The method of claim 14, wherein a thickness of the Co barrier layer along the bottom of the opening is between about 40 Angstroms to about 500 Angstroms, and wherein a thickness of the Co barrier layer along the sidewall of the opening is between about 13 Angstroms to about 130 Angstroms.

19. The method of claim 14, wherein the CoSi layer has a thickness ranging from about 30 Angstroms to about 200 Angstroms.

20. The method of claim 14, wherein the CuMn layer has a thickness ranging from about 100 Angstroms to about 550 Angstroms.

* * * * *